(12) United States Patent
Ishikura et al.

(10) Patent No.: US 9,576,905 B2
(45) Date of Patent: Feb. 21, 2017

(54) SEMICONDUCTOR DEVICE AND MANUFACTURING METHOD THEREOF

(71) Applicant: KABUSHIKI KAISHA TOSHIBA, Tokyo (JP)

(72) Inventors: Taishi Ishikura, Kuwana Mie (JP); Atsunobu Isobayashi, Yokkaichi Mie (JP); Akihiro Kajita, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/052,377

(22) Filed: Feb. 24, 2016

(65) Prior Publication Data

US 2016/0268200 A1   Sep. 15, 2016

(30) Foreign Application Priority Data

Mar. 12, 2015   (JP) .................. 2015-049850

(51) Int. Cl.

| | |
|---|---|
| *H01L 21/768* | (2006.01) |
| *H01L 23/528* | (2006.01) |
| *H01L 23/532* | (2006.01) |
| *H01L 27/115* | (2006.01) |
| *H01L 21/311* | (2006.01) |
| *H01L 21/8234* | (2006.01) |
| *H01L 21/02* | (2006.01) |

(52) U.S. Cl.
CPC ..... *H01L 23/5283* (2013.01); *H01L 21/02271* (2013.01); *H01L 21/31116* (2013.01); *H01L 21/76877* (2013.01); *H01L 21/76885* (2013.01); *H01L 21/823475* (2013.01); *H01L 23/5329* (2013.01); *H01L 23/53219* (2013.01); *H01L 23/53233* (2013.01); *H01L 23/53257* (2013.01); *H01L 23/53276* (2013.01); *H01L 27/115* (2013.01)

(58) Field of Classification Search
CPC ............ H01L 21/76885; H01L 23/528; H01L 23/53276; H01L 21/32051; H01L 23/5283; H01L 23/53209
See application file for complete search history.

(56) References Cited

FOREIGN PATENT DOCUMENTS

JP   2013172103 A   9/2013

*Primary Examiner* — Roy Potter
(74) *Attorney, Agent, or Firm* — Patterson & Sheridan, LLP

(57) ABSTRACT

A semiconductor device includes a first wiring comprising a first conductive material on a semiconductor layer, a second wiring comprising the first conductive material on the semiconductor layer, a third wiring comprising a second conductive material different from the first conductive material, and an insulation film on the semiconductor layer between the first wiring and the second wiring and between the second wiring and the third wiring. The second wiring is provided on at least two sides of the third wiring, and a mean free path of free electrons in the first conductive material is shorter than a mean free path of free electrons in the second conductive material, or the first conductive material shows quantized conduction and the second conductive material does not show quantized conduction. The first wiring, the second wiring, the third wiring, and the insulation film are in one wiring layer provided on the semiconductor layer.

20 Claims, 18 Drawing Sheets

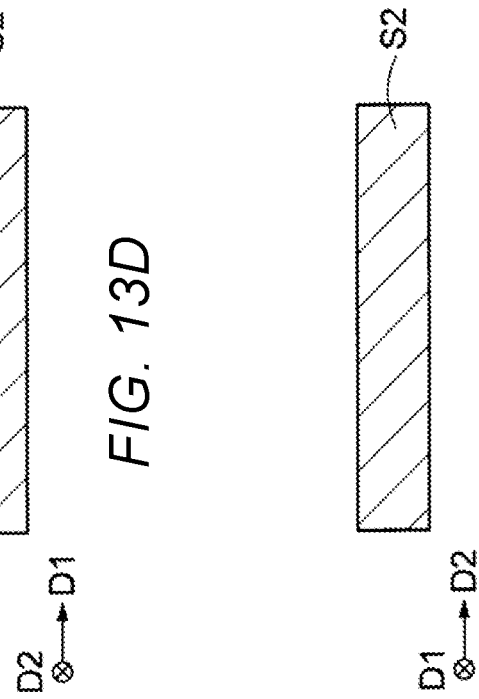
FIG. 13A
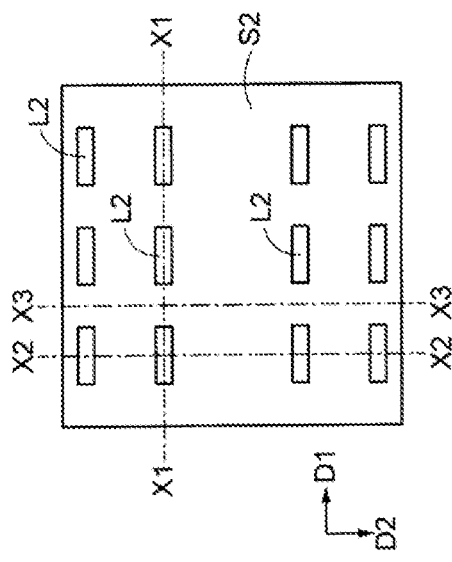
FIG. 13B
FIG. 13C
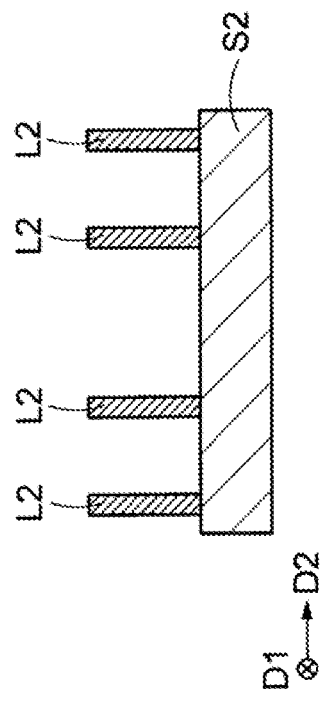
FIG. 13D

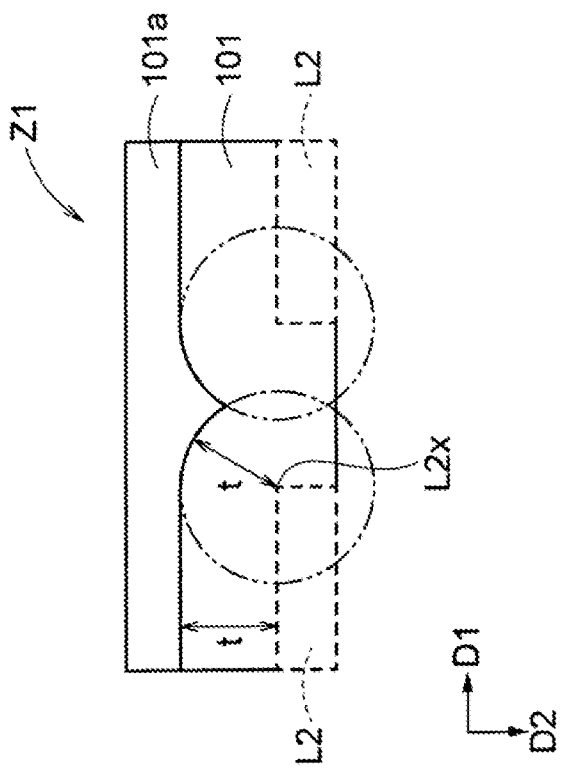
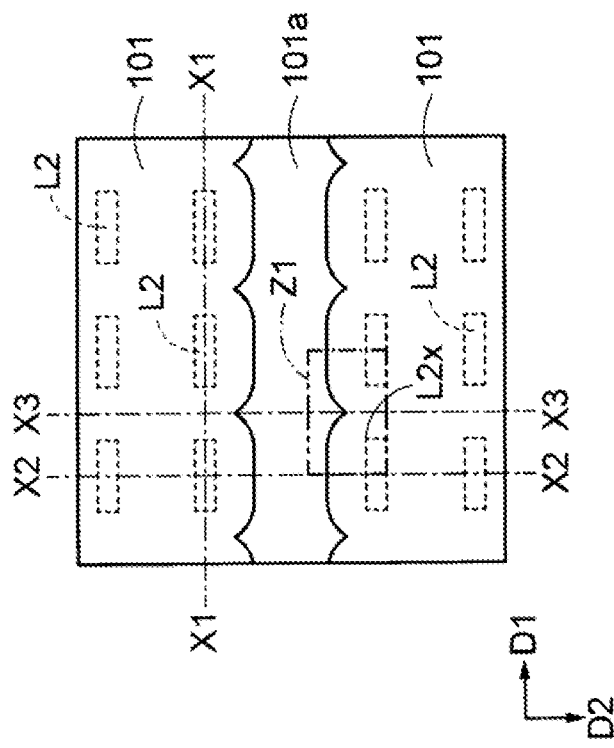
FIG. 18A
FIG. 18B

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2015-049850, filed Mar. 12, 2015, the entire contents of which are incorporated herein by reference.

FIELD

Embodiments described herein relate generally to a semiconductor device and a manufacturing method of the semiconductor device.

BACKGROUND

In recent years, as semiconductor devices have been miniaturized, internal wirings in these devices have also been miniaturized. As the wirings have become smaller, a narrow line effect in which scattering effects caused by interfacial and grain boundaries in copper wirings of the related art begins to predominate, and wiring resistance consequently increases appreciably.

For this reason, wirings in the semiconductor devices according to the related art often fail to satisfy device specifications and/or meet performance targets. Therefore, it is preferable to use a material which is hardly affected by narrow line effects. However, since materials in which narrow line effects are hardly apparent generally have a high bulk specific resistance, when the same material is used for a wide wiring as used for narrow wiring, the wide wiring will have a high resistance and overall device performance may not be substantially improved.

DESCRIPTION OF THE DRAWINGS

FIGS. 2A and 2B to FIGS. 6A and 6B depict processes in a manufacturing method of the semiconductor device according to the first embodiment.

FIGS. 7A and 7B to FIGS. 9A and 9B depict processes in a manufacturing method of a semiconductor device according to a second embodiment.

FIGS. 13A to 13D depict processes in a manufacturing method of a semiconductor device according to the fourth embodiment.

FIGS. 18A and 18B are diagrams which explain the process of a manufacturing method of the semiconductor device according to the fourth embodiment.

DETAILED DESCRIPTION

In general, according to one embodiment, a semiconductor device includes a first wiring comprising a first conductive material on a semiconductor layer, a second wiring comprising the first conductive material on the semiconductor layer, a third wiring comprising a second conductive material different from the first conductive material, and an insulation film on the semiconductor layer between the first wiring and the second wiring and between the second wiring and the third wiring. The second wiring is provided on at least two sides of the third wiring, and a mean free path of free electrons in the first conductive material is shorter than a mean free path of free electrons in the second conductive material, or the first conductive material shows quantized conduction and the second conductive material does not show quantized conduction. The first wiring, the second wiring, the third wiring, and the insulation film are in one wiring layer provided on the semiconductor layer.

Hereinafter, example embodiments are described with reference to the drawings.

First Embodiment

Figure 1A:
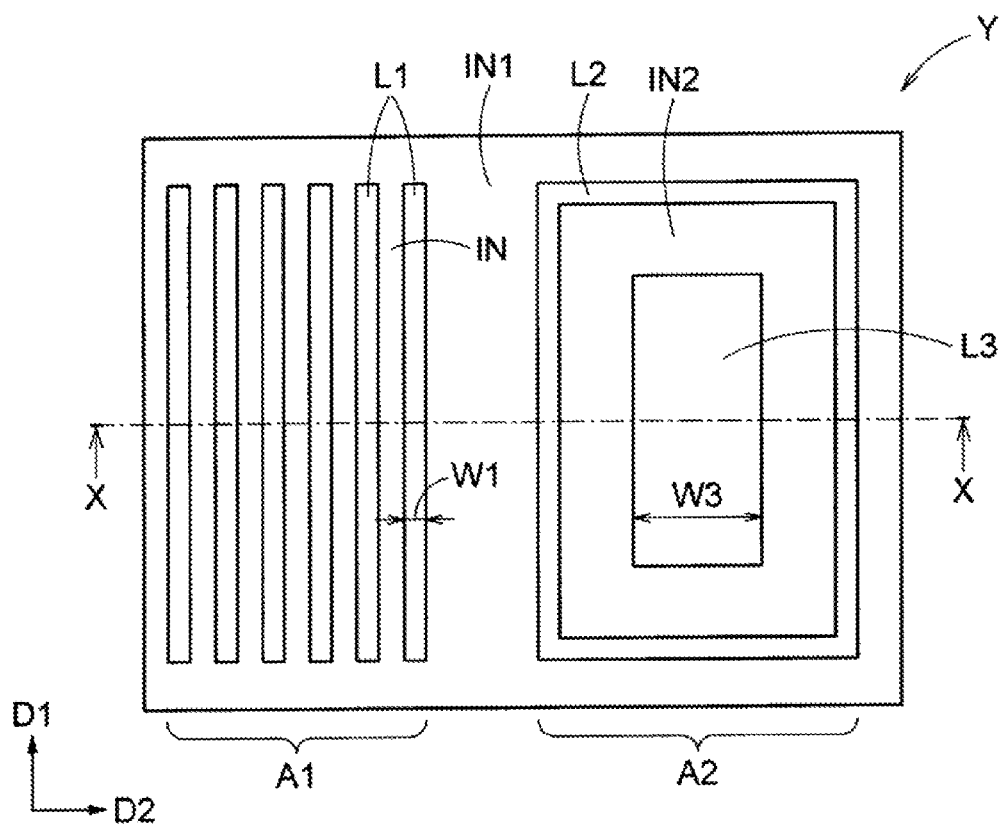
FIGS. 1A and 1B are diagrams which show an example of a configuration of a semiconductor device according to a first embodiment.
Figure 1B:
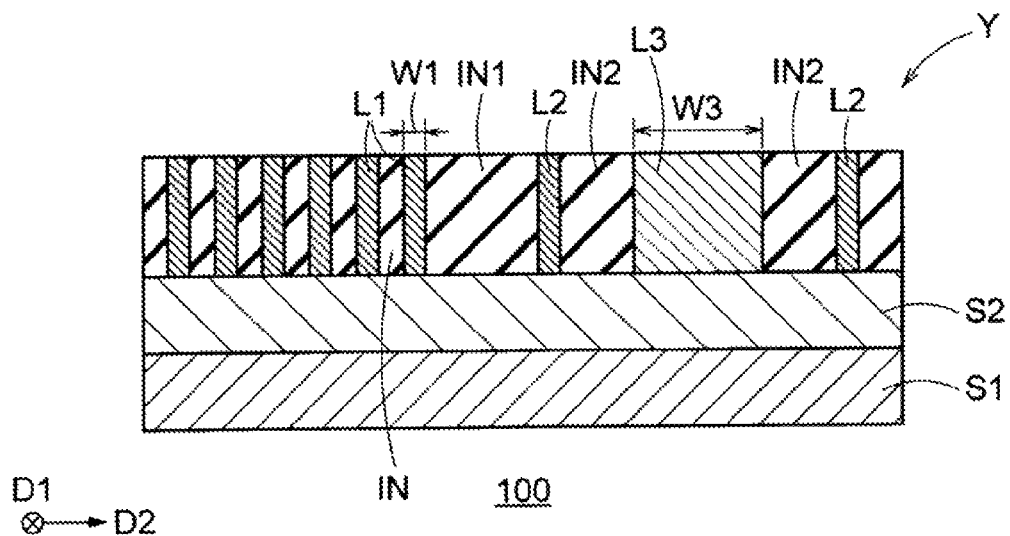

FIGS. 1A and 1B depict a semiconductor according to a first embodiment. FIG. 1A is a plan view which shows a top of the semiconductor device 100. FIG. 1B is a cross-sectional view taken along line X-X of FIG. 1A.

As shown in FIGS. 1A and 1B, the semiconductor device 100 includes a semiconductor substrate S1, a semiconductor layer S2, a first wiring L1, a second wiring L2, a third wiring L3, an insulation film IN, a first insulation film IN1, and a second insulation film IN2.

The semiconductor substrate S1 is, for example, a silicon substrate.

The semiconductor layer S2 is provided on the semiconductor substrate S1. The semiconductor layer S2 is a device layer in which components of a semiconductor device element, such as a MOS transistor, are provided.

The first wiring L1 is provided on the semiconductor layer S2. The first wiring L1 is formed of a first conductive material.

The first wiring L1 is arranged in a memory cell area A1 of, for example, a NAND-type flash memory.

In addition, the insulation film IN is provided on the semiconductor layer S2. The insulation film IN is provided between adjacent first wirings L1.

The second wiring L2 is provided on the semiconductor layer S2. The second wiring L2 is also formed of first conductive material.

Here, for example, as shown in FIGS. 1A and 1B, the second wiring L2 is provided to surround a periphery of the second insulation film IN2 on the semiconductor layer S2.

The third wiring L3 is provided to extend in a first direction D1 on the semiconductor layer S2. The third wiring L3 has a line width W3 (a width in a second direction D2 orthogonal to the first direction D1) greater than a line width W1 (a width in the second direction D2) of the first wiring L1. The third wiring L3 comprises a second conductive material that is different from the first conductive material.

The second wiring L2 is provided on both sides of the third wiring L3 in the second direction D2 and the also the first direction D1, and the third wiring L3 is between different portions of the second wirings L2. Here, as shown in FIGS. 1A and 1B, the third wiring L3 is surrounded by the second wirings L2 on the semiconductor layer S2 in a D1-D2 plane.

The second wiring L2 and the third wiring L3 are disposed, for example, in a peripheral circuit region A2 of a NAND-type flash memory.

The first insulation film IN1 is provided on the semiconductor layer S2. The first insulation film IN1 is between the first wiring L1 and the second wiring L2 in the second direction D2.

The second insulation film IN2 is provided on the semiconductor layer S2. The second insulation film IN2 is between the second wiring L2 and the third wiring L3 so as to be adjacent to and to surround the periphery of the third wiring L3.

The second insulation film IN2 is provided to surround the third wiring L3 on the semiconductor layer S2, that is, in a D1-D2 plane. In a particular example, the second insulation film IN2 may surround the periphery of the third wiring L3 with a constant width from a side surface of the third wiring L3—that is, the distance from the third wiring L3 to the second wiring L2 may be a fixed distance.

The first wiring L1, the second wiring L2, the third wiring L3, the first insulation film IN1, and the second insulation film IN2 are provided in a wiring layer Y on the semiconductor layer S2 (FIG. 1B).

Here, an electrical conductivity of the first conductive material results from free, mobile electrons. The first conductive material is a material which has an electrical conduction mechanism due to free electrons whose mean free path is shorter than a mean free path of free electrons in the second conductive material, or the first conductive material is a material which exhibits quantized conduction.

First, a second metal such as one of Cu and Al, or a second alloy which includes the second metal as a main component is selected as a material for the second conductive material. The second conductive material has a low bulk specific resistance.

In this case, the first conductive material, which is a material having an electrical conduction mechanism due to free electrons whose mean free path is shorter than the mean free path of electrons in the second conductive material, is, for example, a first metal such as any one of Rh, Mo, Al (though Al should be used as the first metal only when the second conductive material is Cu), Ru, Cd, W, Ir, Zn, Ga, Pt, Pd, Nb, In, Co, Ni, Cr, Tc, Os, Ta, Fe, Sn, Tl, and Re; or a first alloy which includes the first metal as a main component; or a silicide of the first metal or the first alloy. In particular, W, Mo, and Ru are materials which are hardly affected by a narrow line effect and also have low bulk specific resistances. According to the narrow line effect, resistivity increases as a result of electron scattering at grain boundaries and/or interfacial.

A first conductive material which exhibits quantized conduction is graphene.

In this manner, the semiconductor device 100 has a wiring material (the first conductive material), which is not significantly affected by the narrow line effect, to narrow wiring (e.g., the first wiring L1) which might be susceptible to the narrow line effect, and has a wiring material (the second conductive material) having a low specific resistance for a wide wiring (e.g., the third wiring L3).

Accordingly, the semiconductor device 100 may obtain improved electrical characteristics.

Here, an example of a manufacturing method of the semiconductor device 100 will be described. FIGS. 2A to 6B are diagrams which show processes in the manufacturing method of the semiconductor device 100 according to the first embodiment. FIGS. 2A, 3A, 4A, 5A, and 6A are top views focused on a region in a periphery of line X-X (see FIG. 1A). FIGS. 2B, 3B, 4B, 5B, and 6B are sectional views which show a cross-section of the semiconductor device 100 taken along line X-X of FIG. 1A at points in the manufacturing method.

Figure 2A:
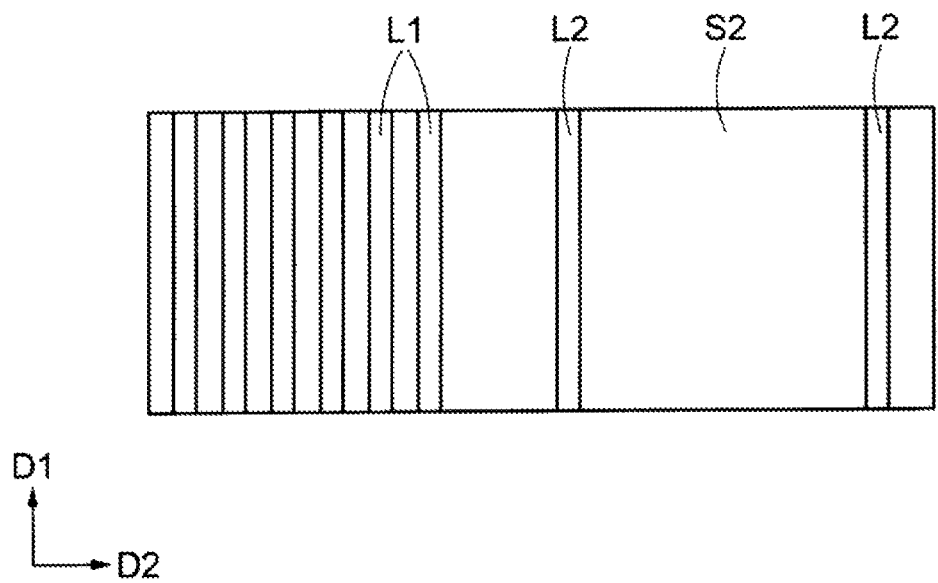
Figure 2B:
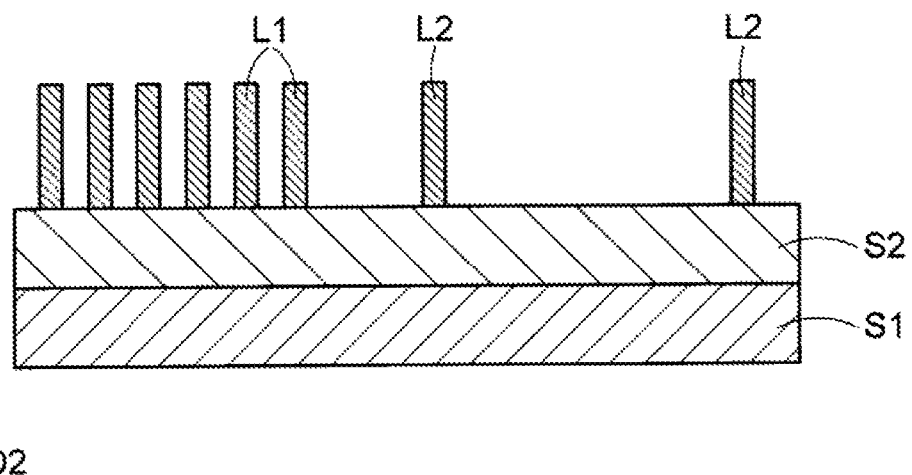

First, as one example, a conductive film made from the first conductive material is formed on the semiconductor layer S2. Thereafter, using, for example, a lithography technique and a reactive ion etching (RIE) method, the conductive film is selectively etched to produce the first wiring L1 and the second wiring L2 as depicted. An additive process rather than a subtractive process maybe adopted for formation of the first wiring L1 and the second wiring L2. Accordingly, the first wiring L1 containing the first conductive material and the second wiring L2 containing the first conductive material are formed on the semiconductor layer S2 (FIGS. 2A and 2B).

Figure 3A:
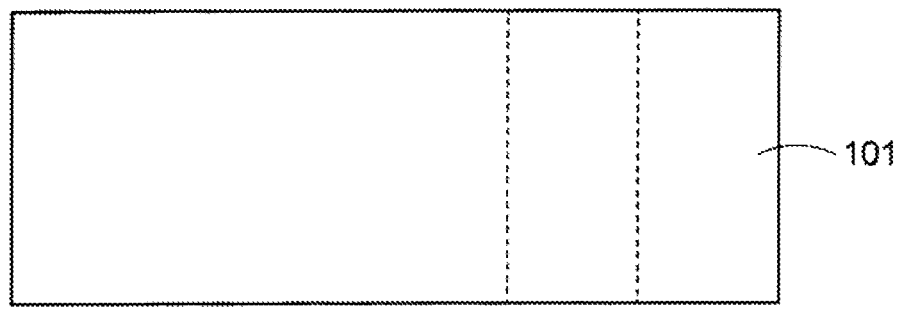
Figure 3A:
Figure 3B:
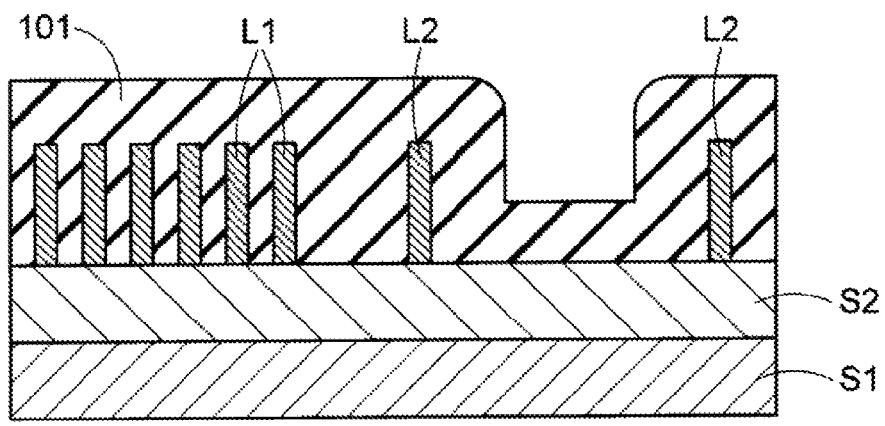
Figure 3B:
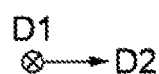

Next, an insulation film 101 is formed on the semiconductor layer S2 in which the first wiring L1 and the second wiring L2 have been formed, using, for example, a chemical vapor deposition (CVD) method (FIGS. 3A and 3B).

Then, the insulation film 101 is anisotropically etched by a reactive ion etching (RIE) method. Here, the insulation film 101 is etched until a surface of the semiconductor layer S2 of a region in which the third wiring L3 is to be formed is exposed.

Figure 4A:
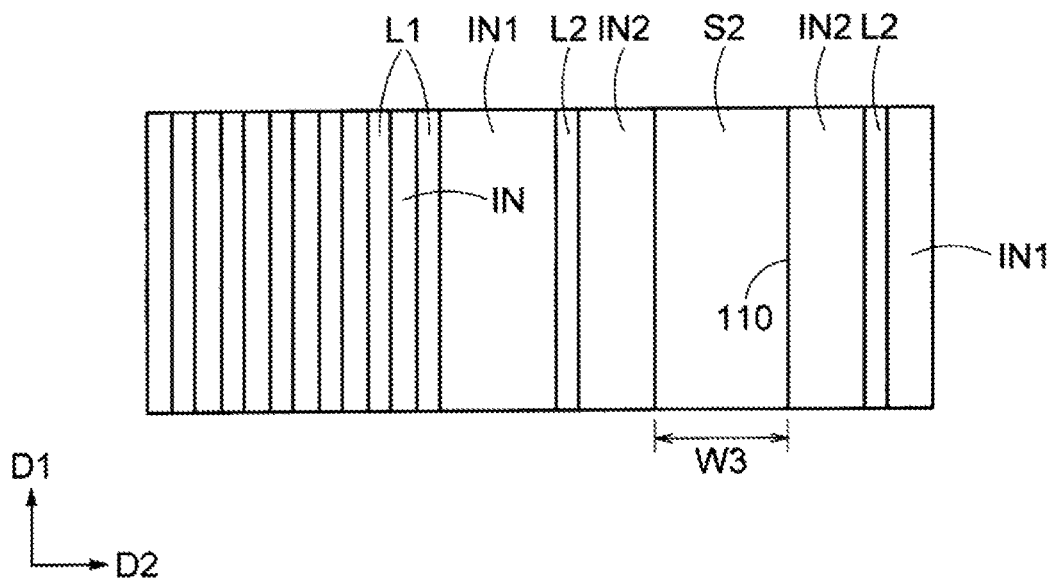
Figure 4B:
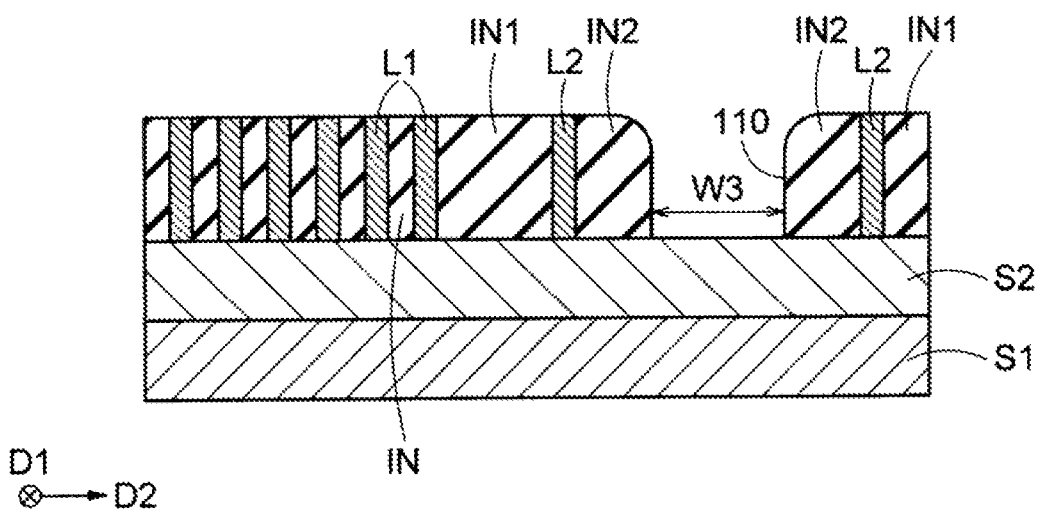

Accordingly, both the first insulation film IN1 positioned between the first wiring L1 and the second wiring L2 and the second insulation film IN2 adjacent to the second wiring L2 are formed on the semiconductor layer S2 (FIGS. 4A and 4B). At this time, the insulation film IN between the adjacent first wirings L1 is also formed.

A width of an opening 110 (see FIG. 4A) in the second insulation film IN2 in a second direction is the same as a width W3 of the third wiring L3.

Figure 5A:
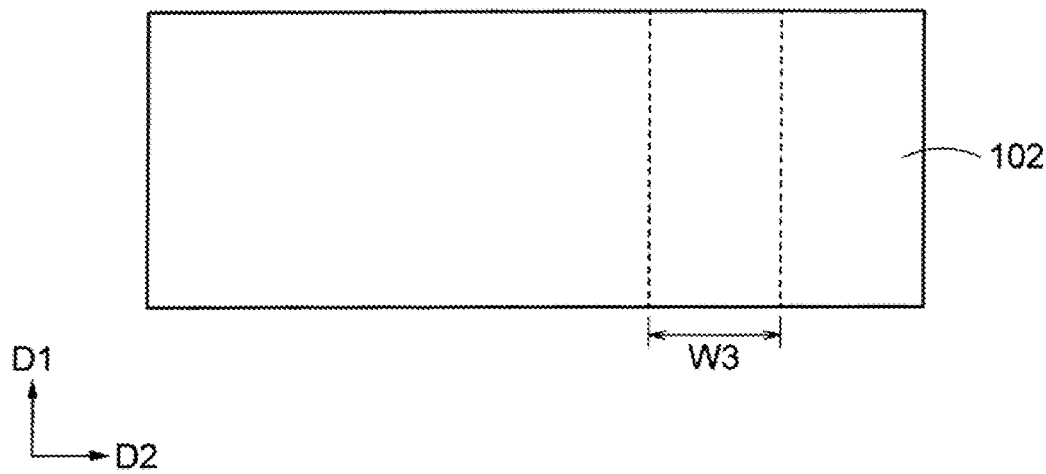
Figure 5B:
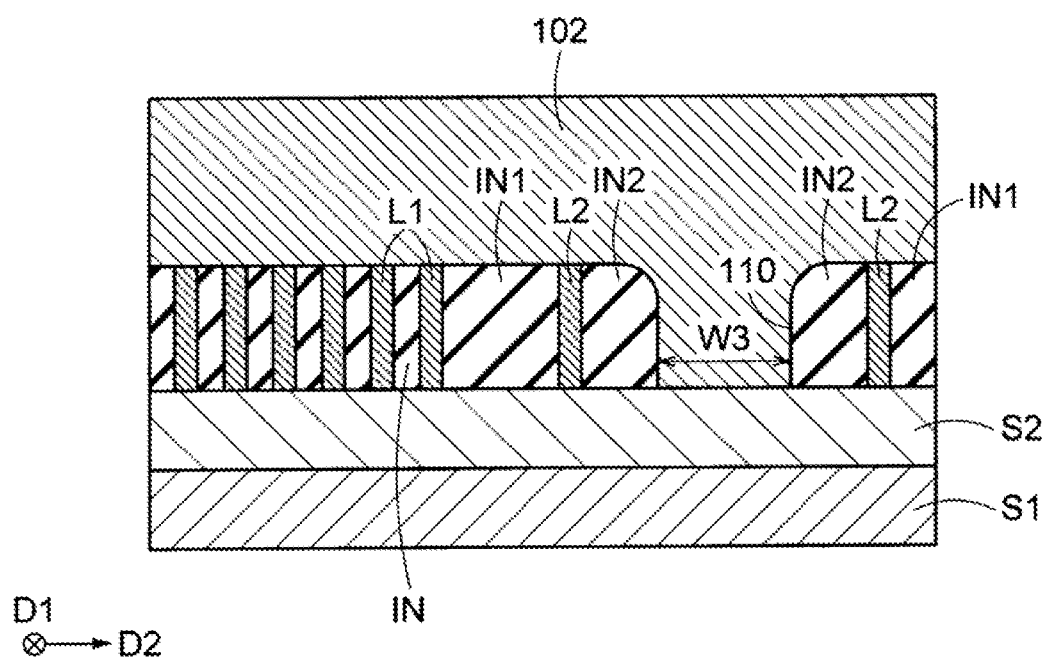

Then, the second conductive material (for example, Cu or Al) described above is deposited on the semiconductor layer S2 so as to be embedded in or fill the opening 110 of the second insulation film IN2 to form a conductive film 102 (FIGS. 5A and 5B).

Next, for example, planarization is performed to remove the overfill portions of the conductive film 102 on the first and the second insulation films IN1 and IN2 and the first and the second wirings L1 and L2 using a chemical mechanical polishing (CMP) method. Here, since the CMP processing is controlled by a processing time, an upper portion of the first and the second insulation films IN1 and IN2 and the first and the second wirings L1 and L2 may be partially removed,— that is, the CMP process need not be stopped exactly at the original upper surface of the insulation films IN, IN1, IN2, or the first wiring L1 and second wiring L2, but rather the substrate may be over polished to some extent with portions of these elements being removed.

Figure 6A:
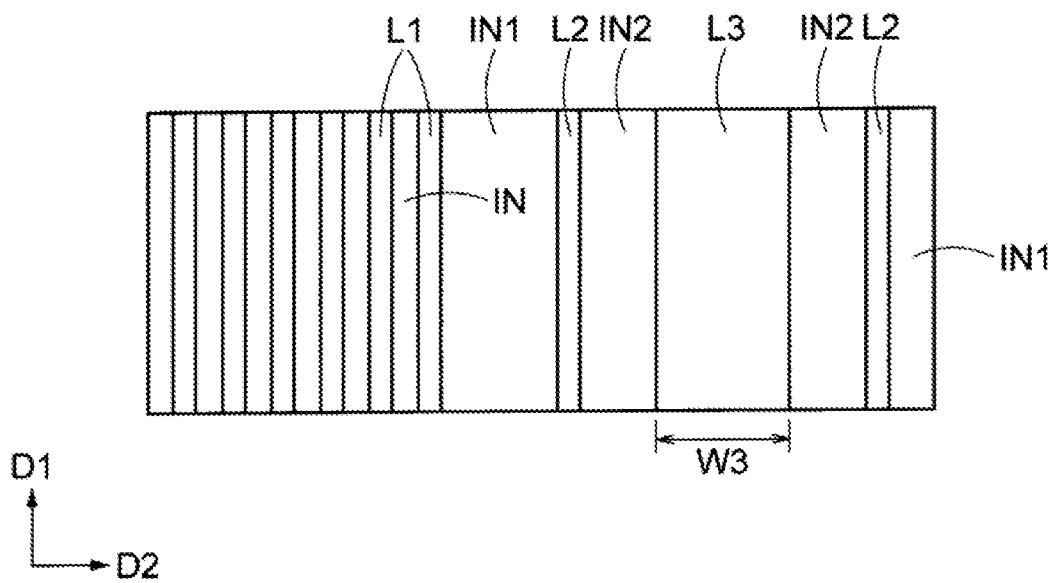
Figure 6B:
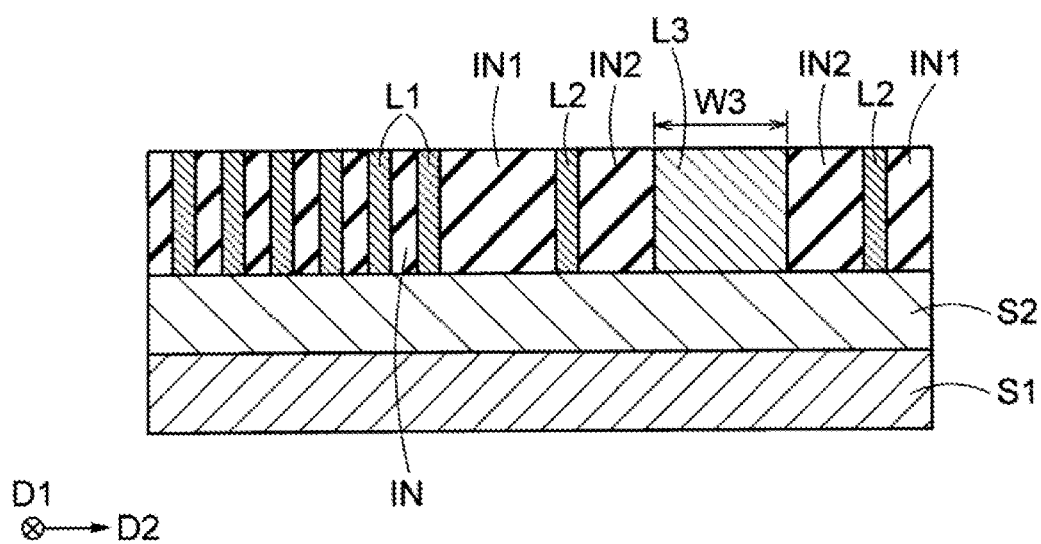

Accordingly, the third wiring L3 which has a line width W3 greater than a line width W1 of the first wiring L1 is formed on the semiconductor layer S2 (FIGS. 6A and 6B). At this time, as shown in FIGS. 6A and 6B, the second insulation film IN2 is between the second wiring L2 and the third wiring L3 and adjacent to the third wiring L3 so as to surround the third wiring L3 in a D1-D2 plane.

Through the processes described above, the semiconductor device 100 shown in FIGS. 1A and 1B is formed.

The CMP processing may be finished when the upper portions of the first and the second insulation films IN1 and IN2 and the first and the second wirings L1 and L2 are first exposed. In this case, an upper portion of the opening 110 of the second insulation film IN2 is wider than a bottom of the opening. That is, a width of an upper portion of the third wiring L3 may be wider than a width of a lower portion of the third wiring L3. Accordingly, it is possible to reduce resistance of the third wiring L3.

Here, in the related art, for example, two or more lithography processes would be required so as to use two different types of wiring materials for a narrow wiring and a wide wiring within the same wiring layer. For this reason, one would expect a decrease in device yield due to poor alignment of the multiple lithography steps or additional handling associated with the extra processing steps, which would result in higher device costs due to lower yield and additional processing steps.

On the other hand, in a manufacturing method of a semiconductor device according to the present embodiment, as described above, a separate lithography process for the third wiring L3 is omitted. Therefore, manufacturing costs are reduced. Furthermore, the third wiring L3 is formed by self-aligned process with respect to the patterns of the first and the second wirings L1 and L2. Therefore, alignment accuracy and the yield may be expected to be improved.

As described above, by the semiconductor device according to the first embodiment, it is possible to obtain improved electrical characteristics.

In particular, by the manufacturing method of a semiconductor device according to the first embodiment, it is possible to improve yield while reducing manufacturing costs.

Second Embodiment

In a second embodiment, another example of a manufacturing method of a semiconductor device will be described. A semiconductor device according to the second embodiment has substantially the same configuration as the semiconductor device 100 according to the first embodiment except for a detailed configuration (wiring structure) of the first and the second wirings. That is, a configuration of the semiconductor device according to the second embodiment is the same as that of FIGS. 1A and 1B in the first embodiment except for the detailed configuration (wiring structure) of the first and the second wirings.

Figure 7A:
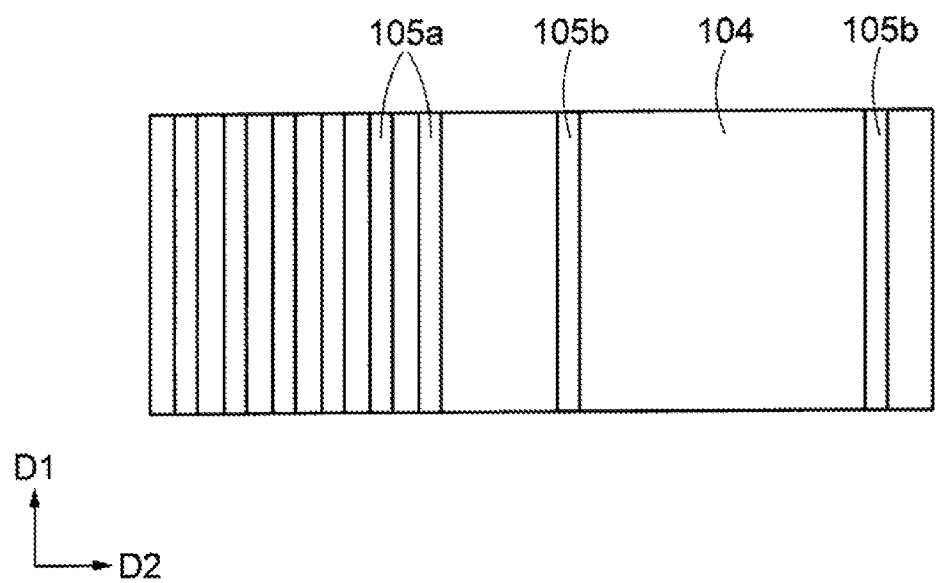
Figure 7B:
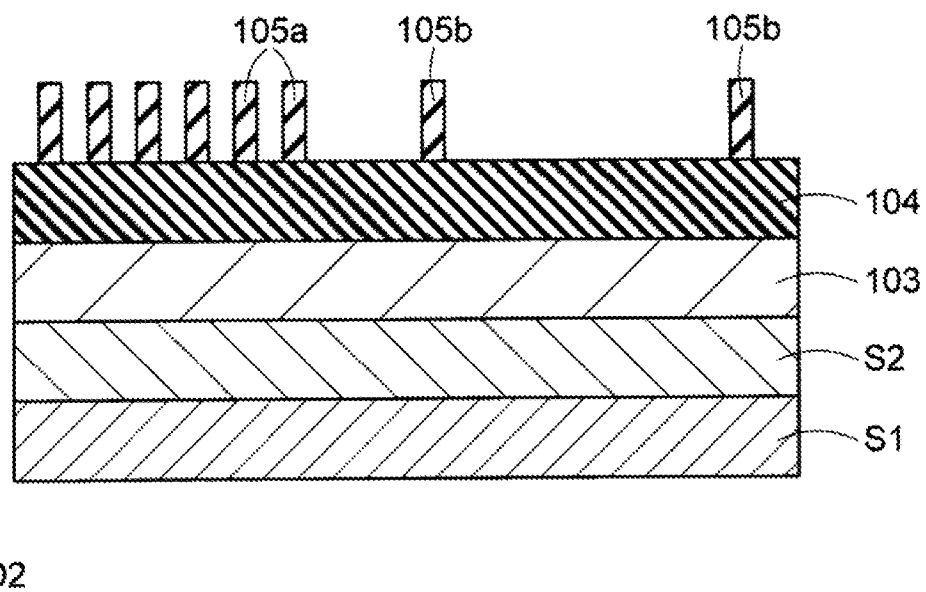
Figure 8A:
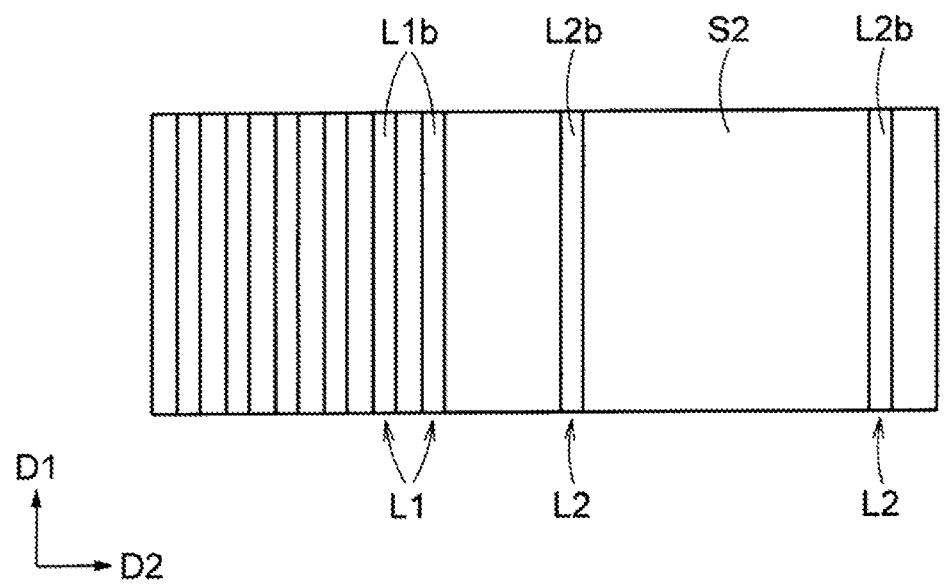
Figure 8B:
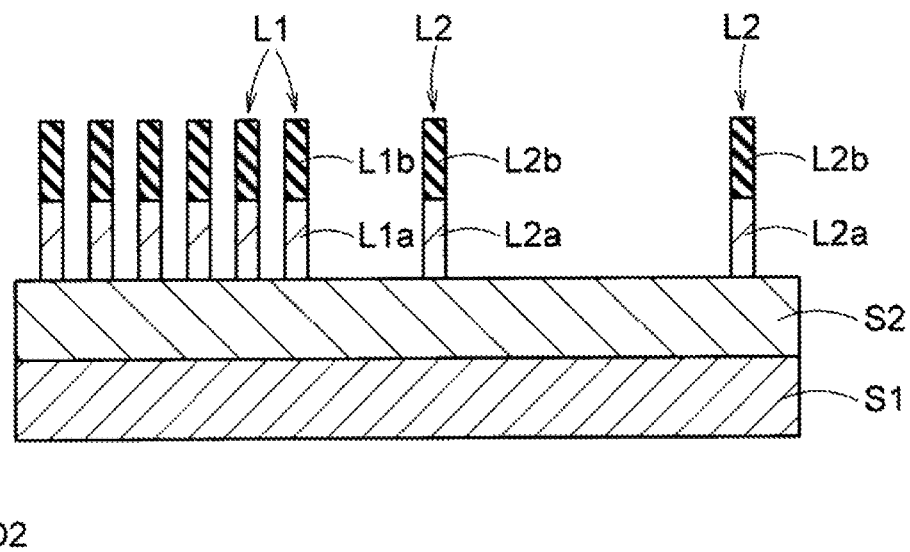
Figure 9A:
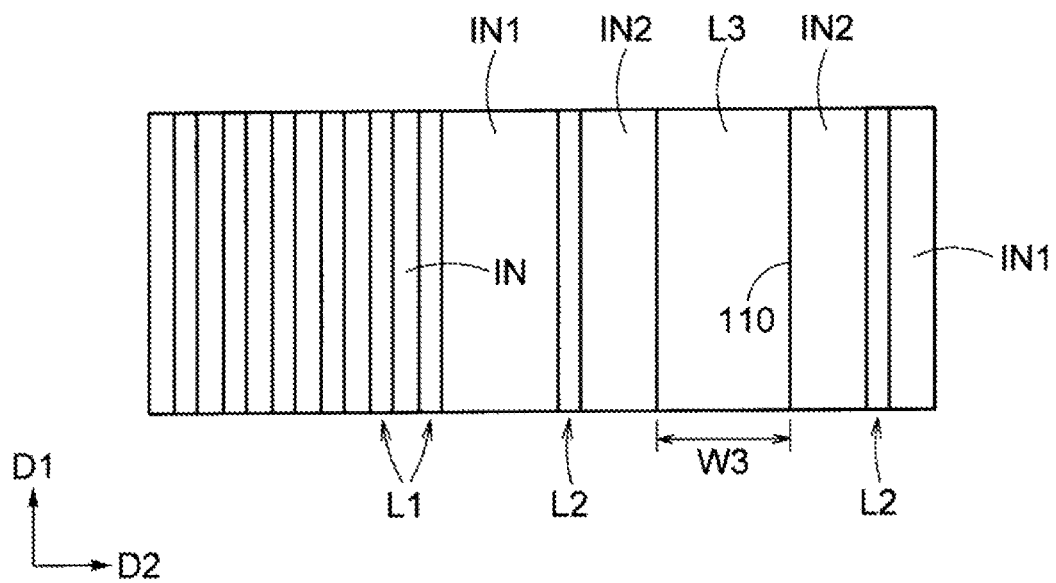
Figure 9B:
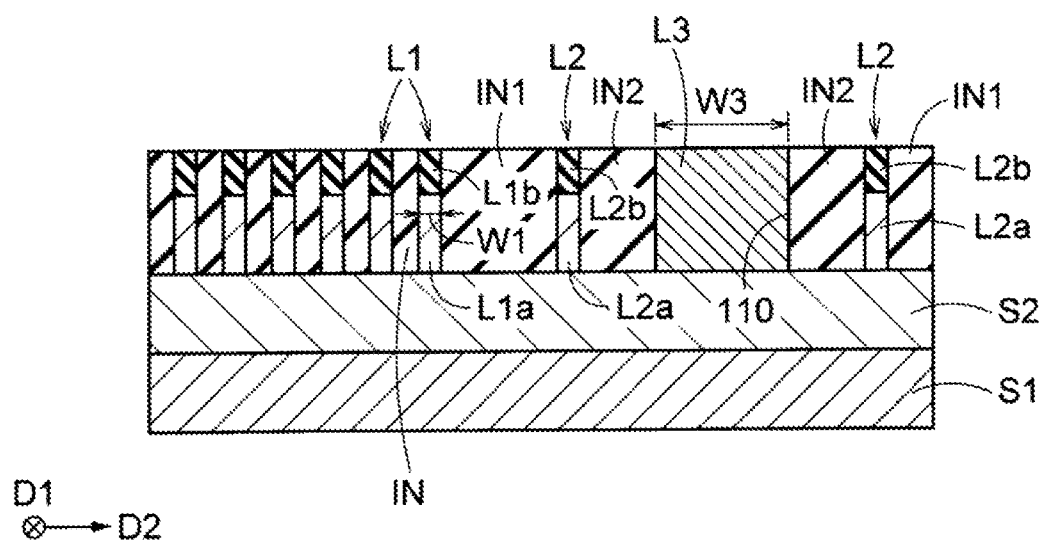

Here, FIGS. 7A to 9B are diagrams which show examples of processes in the manufacturing method of the semiconductor device according to the second embodiment. In FIGS. 7A to 9B, the same reference numerals as in FIGS. 1A to 6B show the same elements as depicted in the first embodiment. FIGS. 7A, 8A, and 9A show top views which show tops of processes in the manufacturing method of a semiconductor device. FIGS. 7B, 8B, and 9B are sectional views which show cross-sections of the semiconductor device (taken along line X-X of FIG. 1A) during the manufacturing process.

First, a conductive film 103 made of the first conductive material is formed on the semiconductor layer S2. Thereafter, a mask film 104 made from $SiO_2$, SiN, Si, or the like is formed on the conductive film 103. Then, resist films 105a and 105b are selectively formed on the mask film 104 using a lithography technique (FIGS. 7A and 7B).

Then, the resist films 105a and 105b are used as a mask, and the conductive film 103 and the mask film 104 are anisotropically etched by, for example, the RIE method or the like. Thereafter, the remaining resist films 105a and 105b are removed. Accordingly, the first wiring L1 and the second wiring L2 are formed (FIGS. 8A and 8B).

Here, as shown in FIGS. 8A and 8B, the first wiring L1 has a stacked structure (wiring structure) which includes a first layer L1a of the first conductive material and a second layer (mask film L1b) stacked on the first layer L1a that is a material different from the first conductive material.

The second wiring L2 also has a stacked structure the same as the first wiring L1. That is, the second wiring L2 has a stacked structure (wiring structure) which includes a first layer L2a of the first conductive material and a second layer (mask film) L2b of the material different from the first conductive material.

The second layers L1b and L2b are, for example, silicon films, silicon oxide films, or silicon nitride films.

Next, for example, in a similar manner as the process shown in FIGS. 3A and 3B, an insulation film is formed on the semiconductor layer S2 using a CVD method. Then, the insulation film is anisotropically etched by a RIE method or the like.

Accordingly, in a similar manner as the process shown in FIGS. 4A and 4B, both the first insulation film IN1 positioned between the first wiring L1 and the second wiring L2 and the second insulation film IN2 adjacent to the second wiring L2 are formed on the semiconductor layer S2. At this time, an insulation film IN is also formed between the first adjacent wirings L1.

Next, in a similar manner as the process shown in FIGS. 5A and 5B, the second conductive material is deposited on the semiconductor layer S2 so as to be embedded in the opening 110 of the second insulation film IN2 to form the conductive film 102.

Then, for example, planarization is performed to remove the conductive film 102 disposed above the first and the second insulation films IN1 and IN2 and the first and the second wirings L1 and L2 is removed by using a CMP method.

Accordingly, the third wiring L3 which has a line width W3 greater than a line width W1 of the first wiring L1 and includes the second conductive material different from the first conductive material is formed on the semiconductor layer S2 (FIGS. 9A and 9B). Thus, similar to the semiconductor device 100 shown in FIGS. 1A and 1B, the second insulation film IN2 is arranged between the second wiring L2 and the third wiring L3 to be adjacent to the third wiring L3 so as to surround the periphery of the third wiring L3.

Through the above processes, the semiconductor device according to the second embodiment is formed.

In the semiconductor device according to the second embodiment, the first and the second wirings L1 and L2 have a stacked structure which includes a first layer having the first conductive material and a second layer stacked on the first layer and having a material different from the first conductive material.

Then, a metal exposed after planarization by the CMP method is a first type (the second wiring L3) and a level of difficulty of the CMP processing on a wide wiring is lowered by the manufacturing method of the semiconductor device according to the second embodiment.

In addition, leakage characteristics between the wirings affected by a residue or contamination left after the CMP processing on the exposed narrow wiring material are also improved in the second embodiment.

The other configurations and manufacturing methods of the semiconductor device are the substantially the same as in the first embodiment.

That is, by the semiconductor device according to the second embodiment, in the same manner as the first embodiment, it is possible to obtain improved electrical characteristics.

In particular, by the manufacturing method of the semiconductor device according to the second embodiment, it is possible to improve device yield while reducing manufacturing costs.

Third Embodiment

In a third embodiment, another example of a semiconductor device will be described. The semiconductor device according to the third embodiment has a configuration the same as the semiconductor device 100 according to the first embodiment, except for arrangements and configurations of the first and the second wirings and a contact wiring. That is, the semiconductor device according to the third embodiment has the same configuration as in FIGS. 1A and 1B according to the first embodiment, except for the arrangements and configurations of the first and the second wirings and the contact wiring.

Figure 10A:
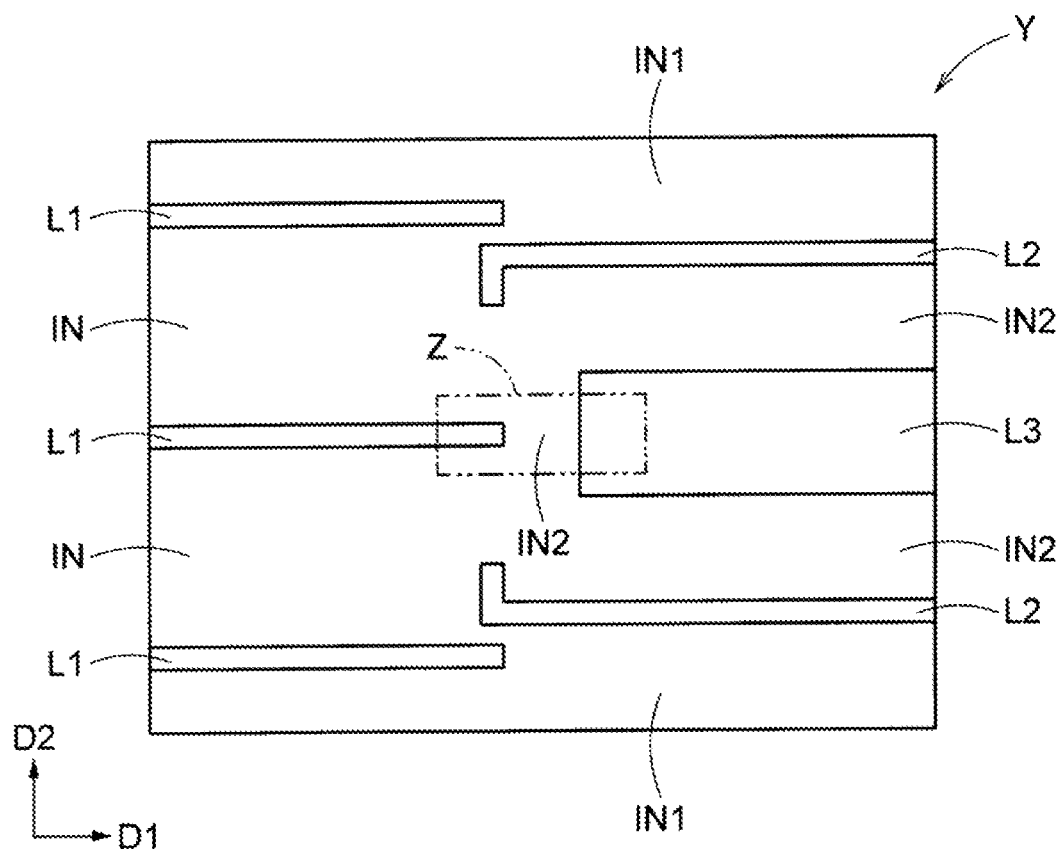
FIGS. 10A and 10B are diagrams which show an example of a configuration of a semiconductor device according to a third embodiment.
Figure 10B:
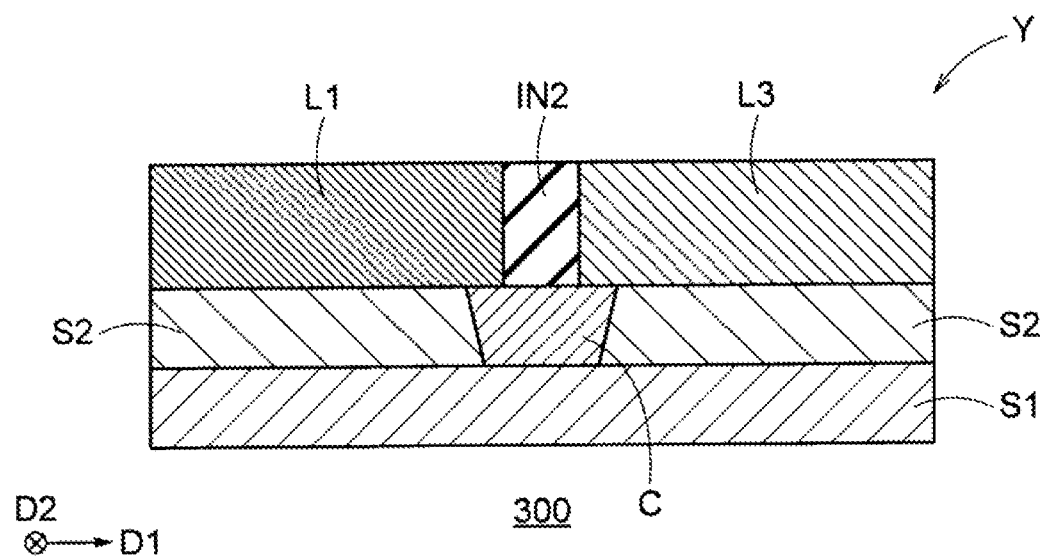
Figure 11:
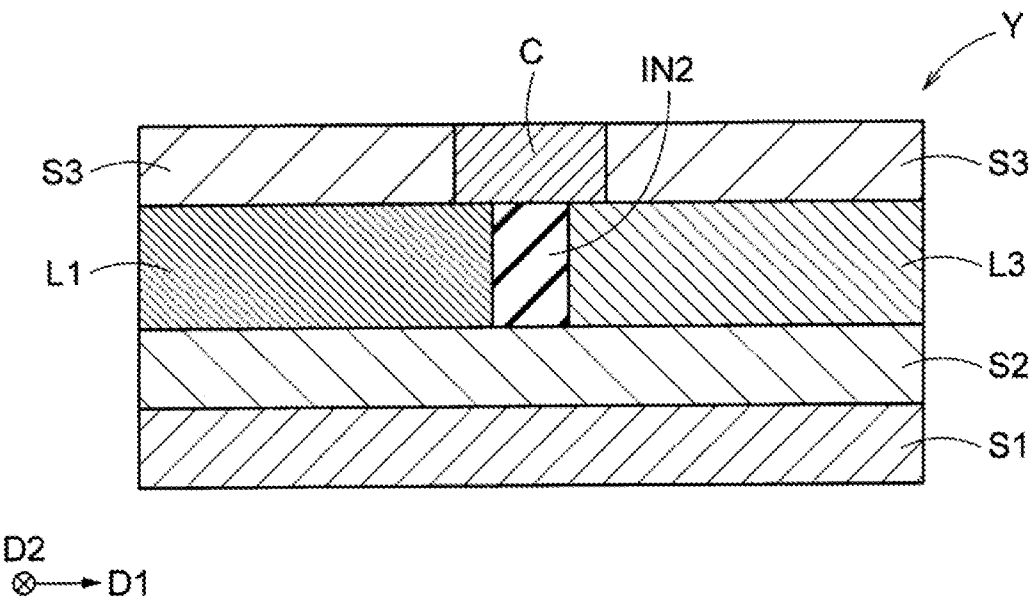
FIG. 11 is a cross-sectional view which shows another example of the cross-section of the semiconductor device, focused on an area Z of FIG. 10A.

FIGS. 10A and 10B are diagrams which show an example of a configuration of a semiconductor device 300 according to the third embodiment. In FIGS. 10A and 10B, the same reference numerals as in FIGS. 1A and 1B show configurations the same as in the first embodiment. FIG. 10A is a top view of the semiconductor device 300. In addition, FIG. 10B is a sectional view which shows an example of a cross-section of the semiconductor device 300 focused on a region Z in FIG. 10A. In addition, FIG. 11 is a sectional view which shows another example of the cross-section of the semiconductor device 300 focused on the region Z of FIG. 10A.

As shown in FIGS. 10A and 10B, the semiconductor device 300 includes the semiconductor substrate S1, the semiconductor layer S2, the first wiring L1, the second wiring L2, the third wiring L3, the insulation film IN, the first insulation film IN1, and the second insulation film IN2.

The first wiring L1, the second wiring L2, the third wiring L3, the first insulation film IN1, and the second insulation film IN2 are provided in one wiring layer Y provided on the semiconductor layer S2.

Here, the second wiring L2 is intermittently provided so as to surround the periphery of the second insulation film IN2 on the semiconductor layer S2. That is, the second wiring L2 does not fully encircle the third wiring L3 in a D1-D2 plane and the second wiring L2 is not a closed loop surrounding the third wiring L3.

That is, in the third embodiment, an end portion of the first wiring L1 is adjacent to an end portion of the third wiring L3 through the second insulation film IN2 (not through the first insulation film IN1 and the second wiring L2) (the region Z of FIGS. 10A and 10B).

Then, a contact wiring C is provided in the semiconductor layer S2 below the wiring layer Y. An upper portion of the contact wiring C is electrically connected to an end portion of the first wiring L1 and an end portion of the third wiring L3. Accordingly, the first wiring L1 and the third wiring L3 are electrically connected via at least contact wiring C.

As shown in FIG. 11, the contact wiring C is provided in a semiconductor layer S3 above the wiring layer Y so as to be electrically connected to the first wiring L1 and the third wiring L3 (FIG. 11).

A structure of the semiconductor device 300 shown in FIGS. 10A and 10B and FIG. 11 reduces the number of wiring levels required in semiconductor device 300 as compared to other semiconductor devices, and thereby improves device yield which would otherwise be reduced due to contact failure or the like. Additionally, resistance due to extension of wiring length (i.e., additionally device wiring due to additional wiring level(s)) may be reduced.

The other characteristics and manufacturing methods of the semiconductor device 300 having a configuration as described above are substantially the same as characteristics of the semiconductor device 100 according to the first embodiment.

That is, by the semiconductor device according to the third embodiment, it is possible to obtain improved electrical characteristics.

In particular, by the manufacturing method of the semiconductor device according to the third embodiment, it is possible to improve the yield while reducing manufacturing costs.

Fourth Embodiment

In a fourth embodiment, another example of a semiconductor device will be described. A configuration of the semiconductor device according to the fourth embodiment is substantially the same as that of the semiconductor device 100 according to the first embodiment, except for arrangements and configurations of the second (L2) and the third (L3) wirings and the second insulation film IN2. That is, the configuration of the semiconductor device according to the fourth embodiment is the same as in FIGS. 1A and 1B of the first embodiment, except for the arrangements and configurations of the second and the third wirings and the second insulation film.

Figure 12:
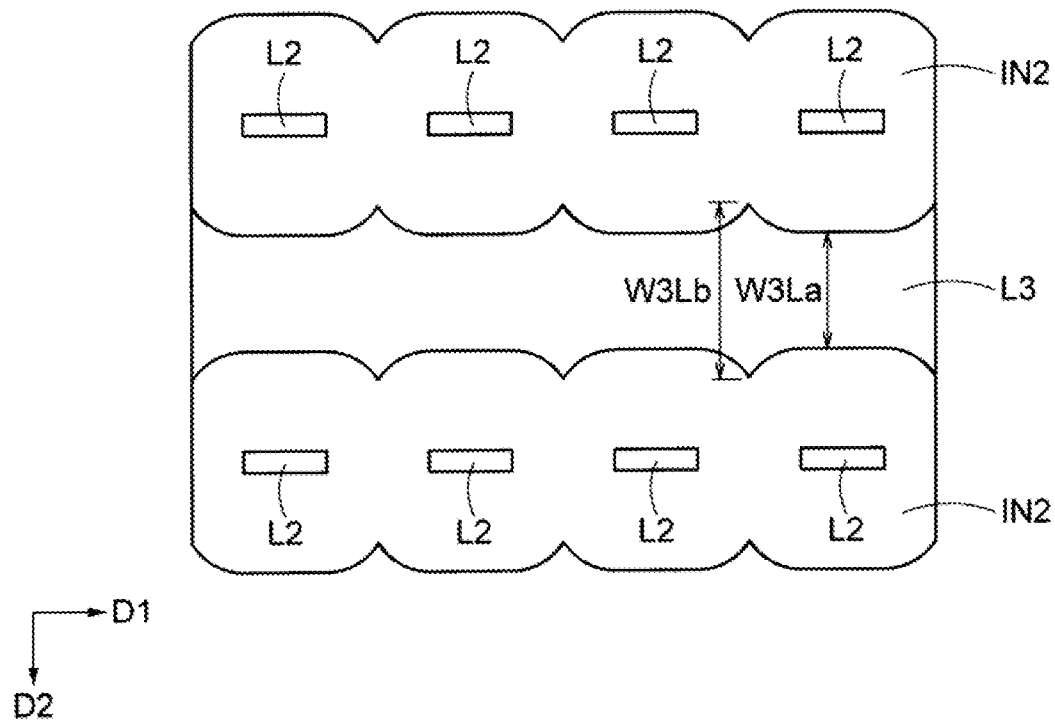
FIG. 12 is a diagram which shows an example of a configuration of wirings according to a fourth embodiment.
Figure 14A:
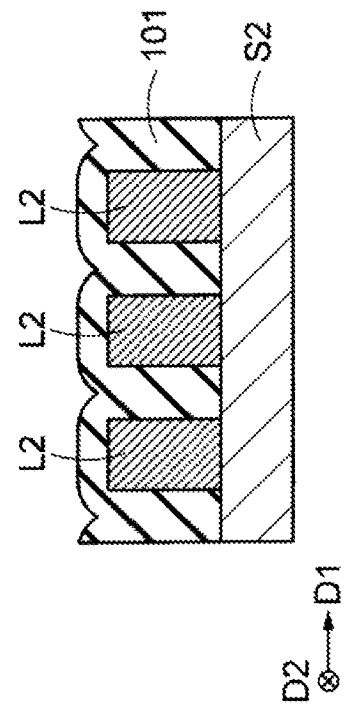
FIGS. 14A to 14D depict additional processes in a manufacturing method of the semiconductor device according to the fourth embodiment.
Figure 14B:
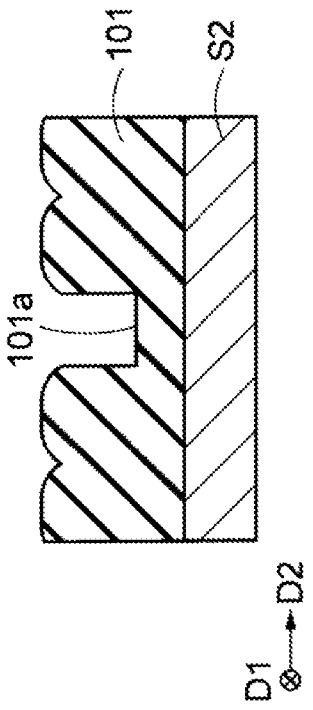
Figure 14C:
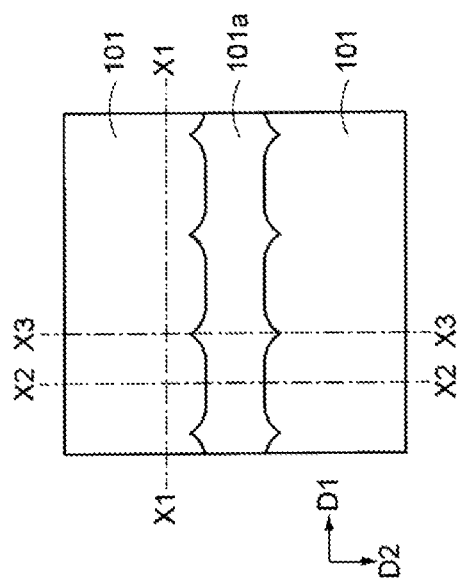
Figure 14D:
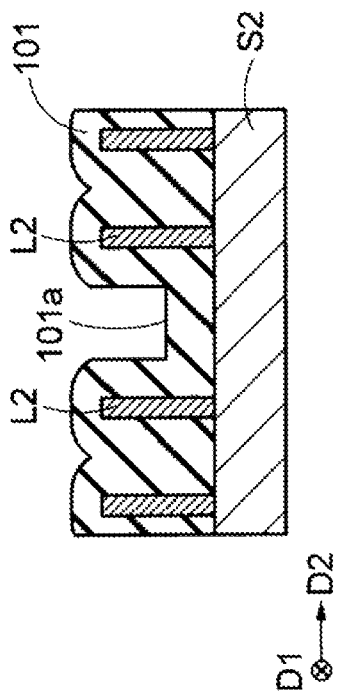
Figure 15A:
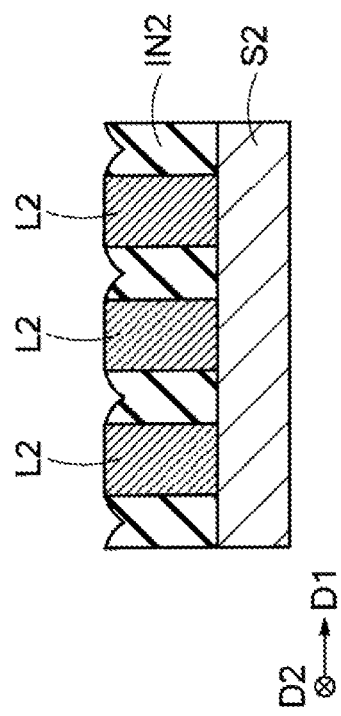
FIGS. 15A to 15D depict additional processes in a manufacturing method of the semiconductor device according to the fourth embodiment.
Figure 15B:
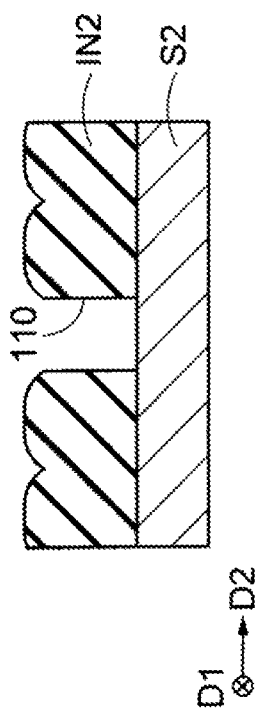
Figure 15C:
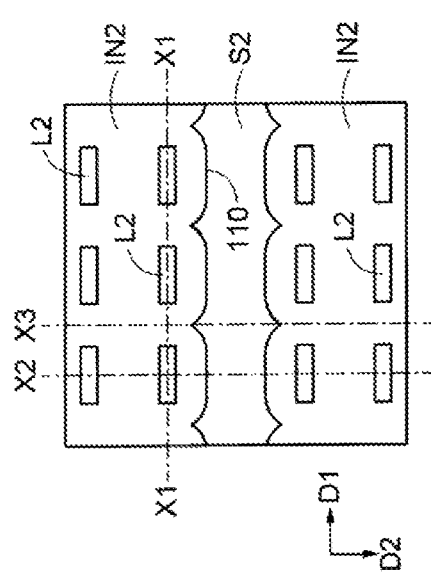
Figure 15D:
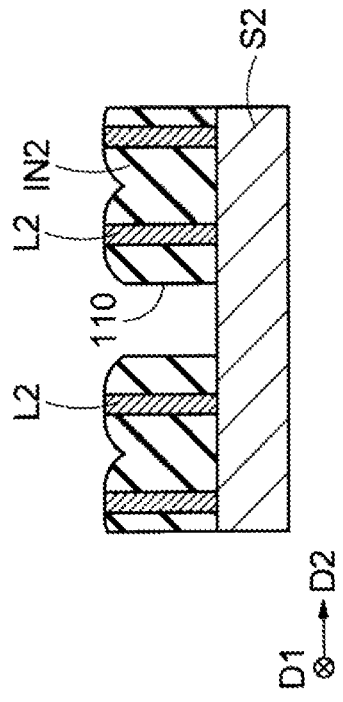
Figure 16A:
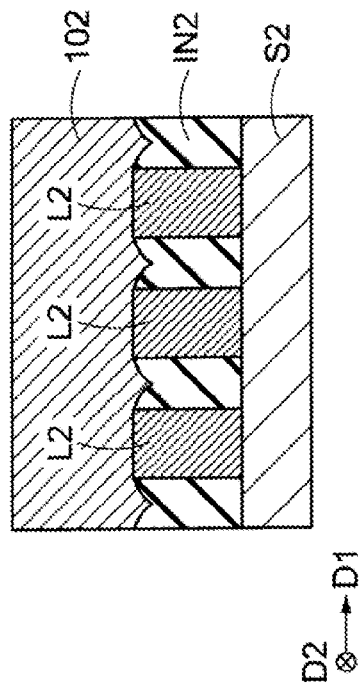
FIGS. 16A to 16D depict additional processes in a manufacturing method of the semiconductor device according to the fourth embodiment.
Figure 16B:
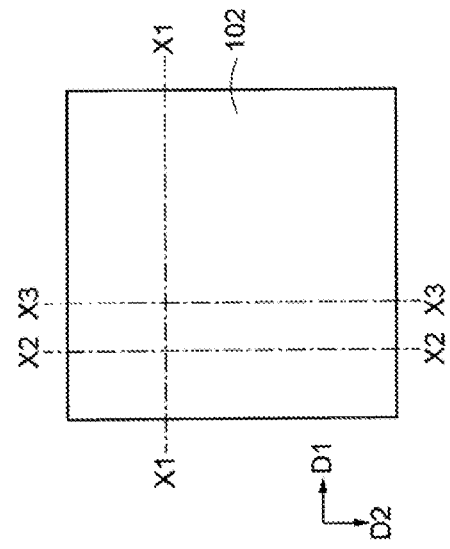
Figure 16C:
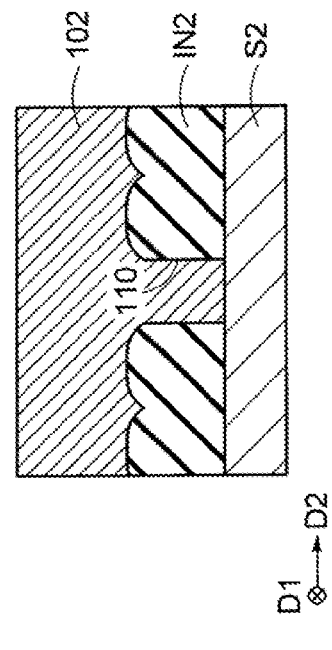
Figure 16D:
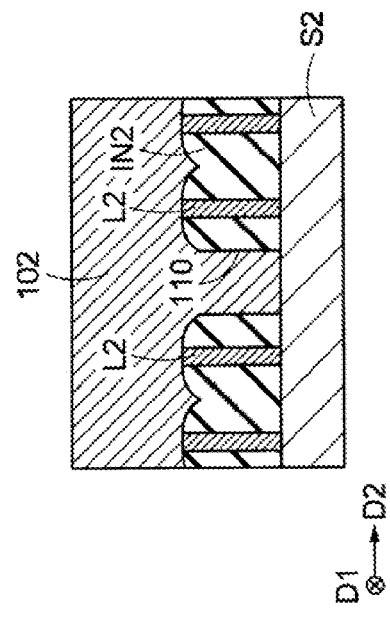
Figure 17B:
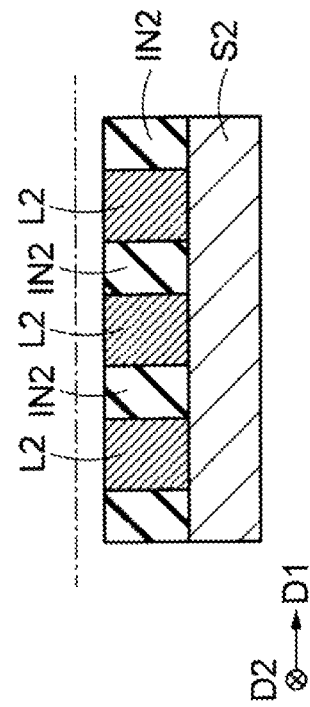
FIGS. 17A to 17D depict additional processes in a manufacturing method of the semiconductor device according to the fourth embodiment.
Figure 17D:
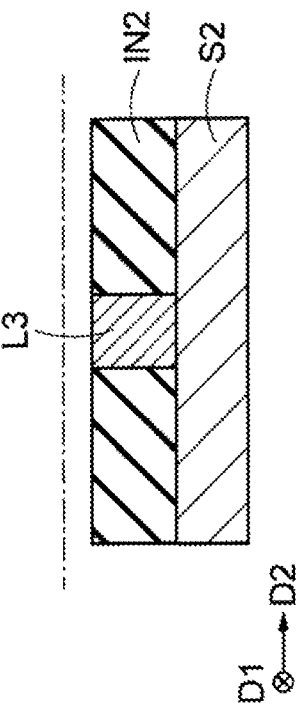
Figure 17A:
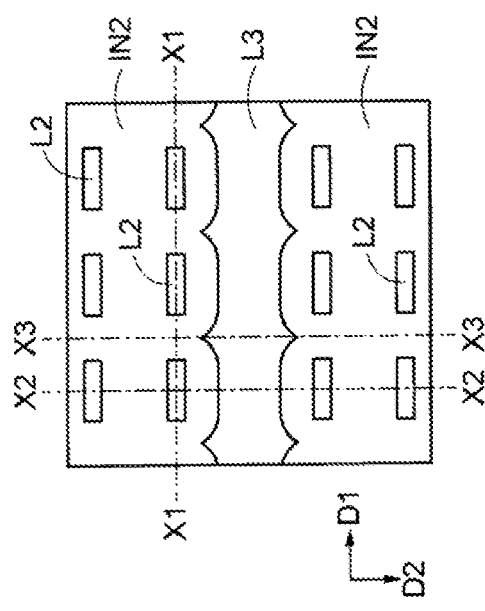
Figure 17C:
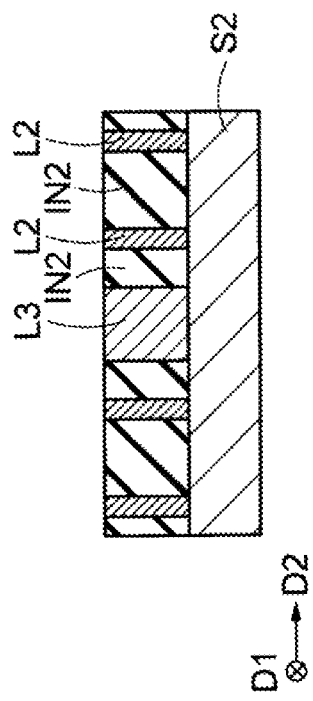

FIG. 12 is a diagram which shows an example of a configuration of the second (L2) and the third (L3) wirings and the second insulation film IN2 of the semiconductor device according to the fourth embodiment. In FIG. 12, reference numerals the same as in FIGS. 1A and 1B represent the same elements as in the first embodiment.

As shown in FIG. 12, the second wiring L2 is intermittently provided on the semiconductor layer S2 in parallel with a first direction D1 along which the third wiring L3 extends.

Accordingly, a metal region in the second insulation film IN2 is reduced, whereby leakage characteristics are improved.

Here, a second width WL3$b$ (along second direction D2) of a region of the third wiring L3 corresponding to a position at which the second wiring L2 is not present (that is, at a position along first direction D1 that is between adjacent portions of the second wirings L2) becomes greater than a first width WL3$a$ (along second direction D2) of a region corresponding to a position at which the second wiring L2 is present along the first direction D1.

Accordingly, as compared to a case where a width of the third wiring L3 is fixed to the first width WL3$a$, it is possible to reduce wiring resistance of the third wiring L3.

The other configurations of the semiconductor device according to the fourth embodiment are substantially the same as that of the semiconductor device according to the first embodiment.

Here, an example of the manufacturing method of a semiconductor device which has a configuration of the fourth embodiment will be described. FIGS. 13A to 17D are diagrams depicting processes in the manufacturing method of the semiconductor device according to the fourth embodiment. FIGS. 13A, 14A, 15A, 16A, and 17A are top views of the semiconductor device. FIGS. 13B, 14B, 15B, 16B, and 17B are sectional views which depict cross-sections of the semiconductor device taken along line X1-X1 (see FIG. 13A) during the manufacturing process. FIGS. 13C, 14C, 15C, 16C, and 17C are sectional views which depict cross-sections of the semiconductor device taken along line X2-X2 (see FIG. 13A) during the manufacturing process. FIGS. 13D, 14D, 15D, 16D, and 17D are sectional views which depict cross-sections of the semiconductor device taken long line X3-X3 (see FIG. 13A) during the manufacturing process.

In the manufacturing process of the semiconductor device according to the fourth embodiment, a conductive film (not shown) that is made from the first conductive material is formed on the semiconductor layer S2. Thereafter, the conductive film is selectively etched using, for example, a lithography technique and a RIE method. Accordingly, the first wiring L1 (not specifically depicted) formed of the first conductive material and the second wiring L2 formed of the first conductive material are disposed on the semiconductor layer S2 (FIGS. 13A to 13D).

In the example of FIGS. 13A to 13D, a plurality of second wirings L2 (which may be referred to as a plurality of portions of the second wiring L2) are arranged in the first direction D1 and the second direction D2 on the semiconductor layer S2 (that is, for example, rows and columns).

Next, the insulation film 101 is formed on the semiconductor layer S2 (FIGS. 14A to 14D) by using a CVD method. The insulation film 101 has an opening 101a which is between a particular adjacent pair of rows of the plurality of second wirings L2 in the second direction D2.

Figure 19A:
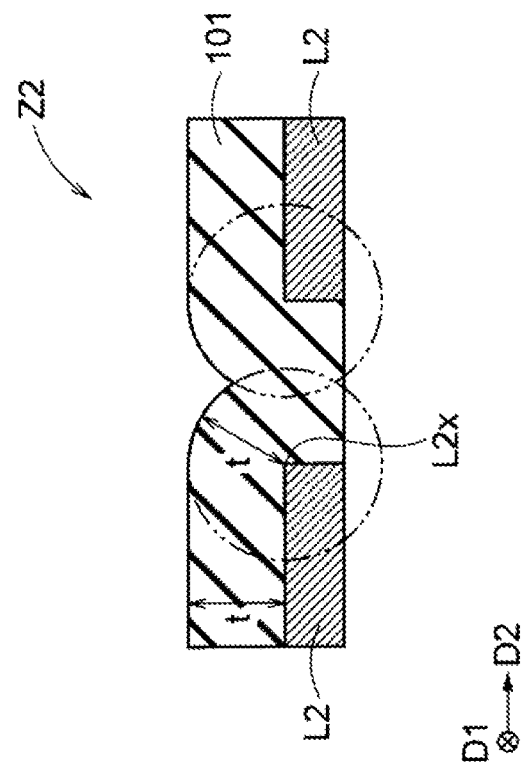
FIGS. 19A and 19B are diagrams which show the process of a manufacturing method of the semiconductor device according to the fourth embodiment.
Figure 19B:
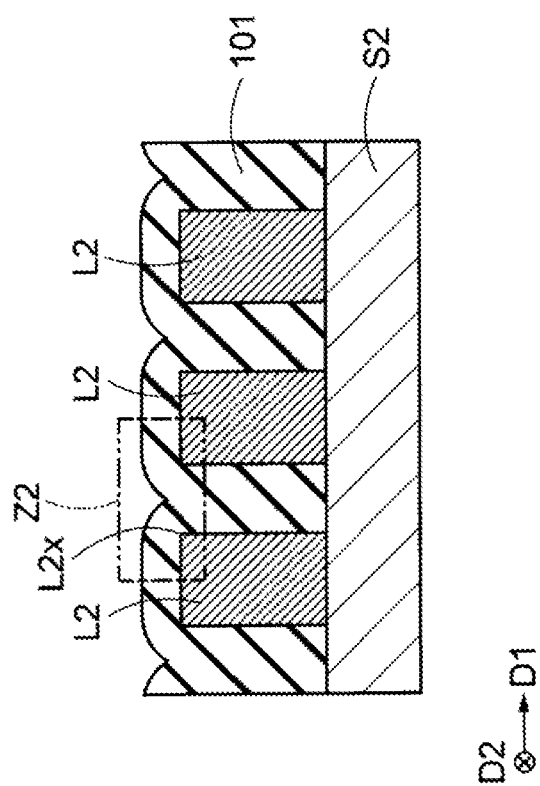

Here, FIGS. 18A to 19B are diagrams for explaining processes of the manufacturing method of the semiconductor device shown in FIGS. 14A to 14D. FIG. 18A is a top view which corresponds to FIG. 14A. FIG. 18B is a top view which shows an enlarged region Z1 of FIG. 18A. FIG. 19A is a top view which corresponds to FIG. 14B. FIG. 19B is a top view which shows an enlarged region Z2 of FIG. 19A.

As shown in FIGS. 18A to 19B, the insulation film 101 is formed by the CVD method in a generally conformal manner, such that a film thickness of the insulation film 101 in a side surface of the second wiring L2 becomes a thickness t. Furthermore, a film thickness of the insulation film 101 in a vicinity of an edge L2x of the upper portion of the second wiring L2 becomes a thickness t in a circular arc shape around the edge L2x. Thus, the width of opening 101a can be controlled by reference to the spacing (in the second direction D2) between a particular pair of adjacent rows of the second wirings L2, the height of the second wirings L2 (in a direction orthogonal to the D1-D2 plane), and the deposited film thickness t of the insulating film 101.

Then, the insulation film 101 is anisotropically etched by the RIE method or the like. Here, the insulation film 101 is etched until a surface of the semiconductor layer S2 of a region on which the third wiring L3 is to be formed is exposed.

Accordingly, both the first insulation film IN1 (not shown) positioned between the first wiring L1 and the second wiring L2 and the second insulation film IN2 adjacent to the second wiring L2 are formed on the semiconductor layer S2 (FIGS. 15A to 15D).

A width of the opening 110 of the second insulation film IN2 in the second direction D2 corresponding to the region in which the third wiring L3 is formed is the same as a width W3 of the third wiring L3.

Next, the second conductive material (for example, Cu or Al) is deposited on the semiconductor layer S2 so as to be embedded in or fill the opening 110 of the second insulation film IN2 to form the conductive film 102 (FIGS. 16A to 16D).

Then, planarization is performed until the conductive film 102 above the first and the second insulation films IN1 and IN2 and the first and the second wirings L1 and L2 is removed by using a CMP method. Here, since the CMP processing is controlled by a processing time, an upper portion of the first and the second insulation films IN1 and IN2 and the first and the second wirings L1 and L2 may be partially removed in the planarization process.

Accordingly, the third wiring L3 which has the line width W3 greater than the line width W1 of the first wiring L1 and contains the second conductive material different from the first conductive material is formed on the semiconductor layer S2 (FIGS. 17A to 17D).

As shown in FIGS. 17A to 17D, the second wiring L2 is intermittently provided on the semiconductor layer S2 in parallel with the first direction D1 in which the third wiring L3 extends. Accordingly, as described above, a metal region in the second insulation film IN2 is reduced, whereby leakage characteristics are improved.

Furthermore, a second width (FIG. 17D and FIG. 12, W3Lb) of the third wiring L3 at a position along the second direction D2 at which the second wiring L2 is not present is greater than a first width (FIG. 17C and FIG. 12, W3La) at a position along the second direction D2 at which the second wiring L2 is present.

Accordingly, as described above, compared to a case when a width of the third wiring L3 is fixed at the first width WL3a, it is possible to reduce wiring resistance of the third wiring L3.

Through the above processes, the semiconductor device according to the fourth embodiment is completed.

That is, by the semiconductor device according to the fourth embodiment, it is possible to obtain improved electrical characteristics.

In particular, by the manufacturing method of the semiconductor device according to the fourth embodiment, it is possible to improve the yield while reducing manufacturing costs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first wiring comprising a first conductive material on a semiconductor layer;

a second wiring comprising the first conductive material on the semiconductor layer;

a third wiring comprising a second conductive material different from the first conductive material; and an insulation film on the semiconductor layer between the first wiring and the second wiring and between the second wiring and the third wiring, wherein the second wiring is provided on at least two sides of the third wiring, a mean free path of free electrons in the first conductive material is shorter than a mean free path of free electrons in the second conductive material, or the first conductive material shows quantized conduction and the second conductive material does not show quantized conduction, and the first wiring, the second wiring, the third wiring, and the insulation film are in one wiring layer provided on the semiconductor layer.

2. The semiconductor device according to claim 1, wherein width of the third wiring in a direction along the semiconductor layer is greater than a width of the first wiring in the direction along the semiconductor layer and a width of the second wiring in the direction along the semiconductor layer.

3. The device according to claim 1, wherein the first conductive material comprises a first metal selected from a group consisting of Rh, Mo, Al, Ru, Cd, W, Ir, Zn, Ga, Pt, Pd, Nb, In, Co, Ni, Cr, Tc, Os, Ta, Fe, Sn, Tl, and Re.

4. The device according to claim 3, wherein the first conductive material is one of the first metal, a first alloy including the first metal as a main component, a silicide of first metal, and a silicide of an alloy including the first metal as a main component.

5. The device according to claim 3, wherein the second conductive material comprises a second metal selected from a group consisting of Cu and Al.

6. The device according to claim 5, wherein the second conductive material is one of the second metal or a second alloy which includes the second metal as a main component.

7. The device according to claim 1, wherein the first conductive material is graphene.

8. The semiconductor device according to claim 1, wherein the second wiring encircles the third wiring in a plane parallel to the semiconductor layer.

9. The semiconductor device according to claim 1, wherein a distance between the second and third wirings in any direction parallel to the semiconductor layer is constant.

10. The semiconductor device according to claim 1, wherein the second wiring is not provided on the semiconductor layer between an end portion of the third wiring and the first wiring.

11. The semiconductor device according to claim 1, wherein the first wiring is a stacked structure including a first layer of the first conductive material and a second layer of a material that is different from the first conductive material.

12. The semiconductor device according to claim 11, wherein the second layer is a silicon film, a silicon oxide film, or a silicon nitride film.

13. The semiconductor device according to claim 1, wherein the second wiring has a floating potential and is not electrically connected to either of the first and third wirings.

14. The semiconductor device according to claim 1, wherein the second wiring is intermittently provided on the semiconductor layer in parallel with a first direction along which the third wiring extends longitudinally, and a second width of the third wiring, in a second direction crossing the first direction, at a position along the first direction at which the second wiring is not present is greater than a first width of the third wiring, in the second direction, at a position along the first direction at the second wiring is present.

15. The semiconductor device according to claim 1, further comprising:

a contact wiring electrically connecting the first wiring and the third wiring.

16. The semiconductor device according to claim 1, wherein the first wiring is in a memory cell region of a NAND-type flash memory, and the second wiring and the third wiring are in a peripheral circuit region of the NAND-type flash memory.

17. A method for manufacturing a semiconductor device, comprising:

forming a first wiring and a second wiring on a semiconductor layer, the first and second wiring each comprising a first conductive material;

forming an insulation film on the semiconductor layer and between the first wiring and the second wiring; and forming a third wiring on the semiconductor layer, the third wiring comprising a second conductive material different from the first conductive material, wherein the second wiring is provided on at least two sides of the third wiring, the insulating film is between the second and third wirings, a mean free path of free electrons in the first conductive material is shorter than a mean free path of free electrons in the second conductive material, or the first conductive material shows quantized conduction and the second conductive material does not show quantized conduction, and the first wiring, the second wiring, the third wiring, and the insulation film are each a same distance from the semiconductor layer in a direction orthogonal to a surface of the semiconductor layer.

18. The method according to claim 17, wherein the insulation film is formed with using a chemical vapor deposition (CVD) method, and the insulation film is anisotropically etched to form an opening in the insulation film for forming the third wiring.

19. The method according to claim 17, wherein the first and second wirings are formed in one lithographic process, the insulation film is deposited as a conformal film on the first and second wirings, and the third wiring is formed on the semiconductor layer in an opening formed in the insulation film between different portions of the second wiring by a reactive ion etching (RIE) process.

20. The method of claim 17, wherein the first conductive material comprises a first metal selected from a group consisting of Rh, Mo, Al, Ru, Cd, W, Ir, Zn, Ga, Pt, Pd, Nb, In, Co, Ni, Cr, Tc, Os, Ta, Fe, Sn, Tl, and Re; and the second conductive material comprises a second metal selected from a group consisting of Cu.

* * * * *